United States Patent
Seo

(10) Patent No.: US 10,490,996 B2
(45) Date of Patent: Nov. 26, 2019

(54) INTEGRATED CIRCUIT

(71) Applicant: SK hynix Inc., Gyeonggi-do (KR)

(72) Inventor: Jin-Cheol Seo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 364 days.

(21) Appl. No.: 15/061,692

(22) Filed: Mar. 4, 2016

(65) Prior Publication Data

US 2017/0040791 A1 Feb. 9, 2017

(30) Foreign Application Priority Data

Aug. 5, 2015 (KR) ........................ 10-2015-0110454

(51) Int. Cl.
| | | |
|---|---|---|
| H02H 3/20 | (2006.01) |
| H01L 23/528 | (2006.01) |
| H01L 27/02 | (2006.01) |
| H01L 23/60 | (2006.01) |
| H01L 25/065 | (2006.01) |
| H02H 9/04 | (2006.01) |
| H05K 1/02 | (2006.01) |

(52) U.S. Cl.
CPC .......... *H02H 3/202* (2013.01); *H01L 23/528* (2013.01); *H01L 23/60* (2013.01); *H01L 27/0296* (2013.01); *H01L 25/065* (2013.01); *H01L 27/0251* (2013.01); *H02H 9/04* (2013.01); *H02H 9/046* (2013.01); *H05K 1/0259* (2013.01)

(58) Field of Classification Search
USPC .......................................... 361/56, 91.1, 111
See application file for complete search history.

(56) References Cited

U.S. PATENT DOCUMENTS

| | | | | |
|---|---|---|---|---|
| 5,946,175 A | * | 8/1999 | Yu | H03K 17/08122 361/56 |
| 2008/0316660 A1 | * | 12/2008 | Huang | H02H 9/046 361/56 |
| 2009/0091870 A1 | * | 4/2009 | Huang | H02H 9/046 361/56 |
| 2012/0162833 A1 | * | 6/2012 | Russ | H02H 9/046 361/56 |
| 2012/0162836 A1 | * | 6/2012 | Furuta | H01L 23/62 361/56 |
| 2013/0321962 A1 | * | 12/2013 | Lai | H01L 27/0292 361/56 |

FOREIGN PATENT DOCUMENTS

KR 1020140038289 3/2014

* cited by examiner

*Primary Examiner* — Danny Nguyen
(74) *Attorney, Agent, or Firm* — IP & T Group LLP

(57) ABSTRACT

An integrated circuit includes a signal transmission block suitable for transmitting signals between a pad and an internal circuit, an electrostatic discharge block suitable for protecting the internal circuit from an electrical shock transmitted through the signal transmission block, and a control block suitable for controlling decoupling/coupling operations of the signal transmission block and the electrostatic discharge block.

11 Claims, 2 Drawing Sheets

INTEGRATED CIRCUIT

CROSS-REFERENCE TO RELATED APPLICATIONS

The present application claims priority of Korean Patent Application No. 10-2015-0110454, filed on Aug. 5, 2015, which is incorporated herein by reference in its entirety.

BACKGROUND

1. Field

Exemplary embodiments of the present invention relate to a semiconductor design technology, and more particularly to an integrated circuit including an electrostatic discharge circuit.

2. Description of the Related Art

In general, semiconductor devices, such as a Double Data Rate Synchronous Dynamic Random Access Memory (DDR SDRAM), may include an ElectroStatic Discharge (ESD) circuit for protecting internal circuits from an abnormal electrical shock transferred from an external device. The internal circuits of the semiconductor device may be generally formed of Metal Oxide Semiconductor (MOS) elements. Since a gate region of the MOS elements has high impedance, a gate metal oxide layer may often be damaged due to an electrical shock. Recent developments in semiconductor technology have resulted in further decreases in the thickness of the gate oxide layer rendering it even more vulnerable to damage due to an electrical shock. Accordingly, an ESD circuit for protecting the internal circuits is no longer optional but an essential component of a semiconductor device. An integrated circuit may be exposed to an electrical shock during its manufacturing or during any state before its normal operation.

In order to evaluate the resilience and performance of an ESD circuit in protecting internal circuits of a semiconductor device from an electrical shock, various standard models for an electrostatic discharge are often used. Generally, electrostatic discharge models may be classified into the following three types.

A first model known as a Human Body Model (HBM) simulates a case where electrostatic charges from a human body are discharged to an integrated circuit. A second model known as a Machine Model (MM) simulates a case where electrostatic charges from a metallic machine in a fabrication process of an integrated circuit are discharged to the integrated circuit. Lastly, a third model known as a Charged Device Model (CDM) simulates a case where electrostatic charges from an integrated circuit in a fabrication process such as a package assembling process are discharged to a ground or a conductor of an external device. The electrostatic charges, may be either positive or negative, and generally may be discharged upon physical contact of the integrated circuit with another object. The flow direction of the charges depends upon the polarity of the charges.

When an electrical shock occurs, a typical ESD circuit clamps an over-voltage to be a predetermined voltage by using a Bipolar Junction Transistor (BJT) and passes an over-current to a power source line. For example, the typical ESD circuit may be formed of a grounded gate MOS transistor (ggMOSFET), a gate-coupled MOSFET (gc-MOS), a Bipolar Junction Transistor (BJT), or a diode. The typical ESD circuit may cause a parasitic capacitance or a subordinate effect such as a leakage current, during the normal operation.

SUMMARY

An aspect of the present invention is directed to an integrated circuit that may control the capacitive component of an ESD circuit.

According to an embodiment of the present invention, an integrated circuit may include: a signal transmission line suitable for transmitting signals between a pad and an internal circuit; an electrostatic discharge block suitable for protecting the internal circuit from an electrical shock transmitted through the signal transmission line; and a control block suitable for controlling the electrostatic discharge block to be selectively decoupled to the signal transmission line.

The control block may electrically decouple the electrostatic discharge block from the signal transmission line.

The control block may physically decouple the electrostatic discharge block from the signal transmission line.

The control block may couple the electrostatic discharge block to the signal transmission line before a normal operation and decouple the electrostatic discharge block from the signal transmission line during the normal operation. According to another embodiment of the present invention, an integrated circuit may include: a detection block suitable for generating a control signal by detecting a stable circuit operation moment; a signal transmission line suitable for transmitting signals between a pad and an internal circuit including the detection block; an electrostatic discharge block suitable for protecting the internal circuit from an electrical shock transmitted through the signal transmission line; and a control block suitable for controlling the electrostatic discharge block to be selectively decoupled to the signal transmission line, based on the control signal.

The detection block may detect a voltage level of a power source used for the internal circuit to activate the control signal.

The control block may electrically decouple the electrostatic discharge block from the signal transmission line in response to the control signal.

According to another embodiment of the present invention, a multi-chip package may include: a plurality of semiconductor devices coupled to a common transmission line, wherein each of the semiconductor devices may includes: an internal circuit coupled to the common transmission line; an electrostatic discharge block suitable for protecting the internal circuit from an electrical shock transmitted through the common transmission line; and a control block suitable for controlling the electrostatic discharge block to be selectively decoupled to the common transmission line.

At least one electrostatic discharge block among the electrostatic discharge blocks may correspond to the respective semiconductor devices is decoupled from the common transmission line.

The multi-chip package may further include: a controller suitable for controlling the respective control blocks included in the semiconductor devices.

The controller may control a capacitive component of the electrostatic discharge block reflected on the common transmission line by controlling the respective control blocks during a normal operation.

Before a normal operation, an electrostatic discharge block may correspond to a semiconductor device that is arranged in an electrically closest position from a place where the electrical shock is applied, is coupled, and the electrostatic discharge blocks corresponding to the other semiconductor devices are decoupled.

DETAILED DESCRIPTION

Exemplary embodiments of the present invention are described below in more detail with reference to the accompanying drawings. These embodiments are provided so that this disclosure is thorough and complete and those skilled in the art may practice the invention. Hence, it is noted that the described embodiments are mere examples of the invention and are not intended to limit the scope of the invention.

It is further noted that the terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "includes," "comprising," and/or "including" when used in this specification, indicate the presence of any stated features, and do not preclude the presence or addition of one or more other features. As used herein, the term "and/or" indicates any and all combinations of one or more of the associated listed items.

Figure 1:
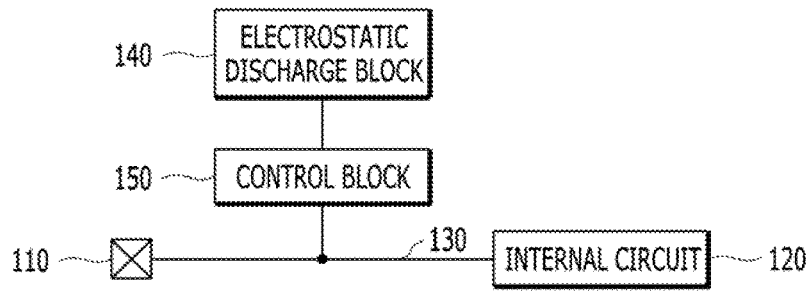
FIG. 1 is a block diagram illustrating an integrated circuit according to an embodiment of the present invention.

FIG. 1 is a block diagram illustrating an integrated circuit according to an embodiment of the present invention.

Referring to FIG. 1, an integrated circuit according to an embodiment of the invention may include a pad 110, a signal transmission line 130, an electrostatic discharge block 140, and a control block 150. The pad 110 may receive signals from an external device or output the signals from the inside. The signal transmission line 130 may transmit the signals between the pad 110 and an internal circuit 120.

The electrostatic discharge block 140 may protect the internal circuit 120 from an electrical shock transmitted from the external device.

The control block 150 may control an operation of decoupling the electrostatic discharge block 140 from the signal transmission line 130. The control block 150 may control an operation of coupling the electrostatic discharge block 140 to the signal transmission line 130. Hereinafter, an example of a simple operation for the integrated circuit is described, wherein the integrated circuit may control the control block 150 and couple the electrostatic discharge block 140 to the signal transmission line 130 in case that an electrical shock is predicted. Therefore, since the electrostatic discharge block 140 is coupled to the signal transmission line 130, the internal circuit 120 may be protected from the electrical shock even though the electrical shock is transmitted.

The integrated circuit may control the control block 150 and decouple the electrostatic discharge block 140 from the signal transmission line 130 in case that there is no electrical shock, e.g., in a normal operation. Therefore, a capacitive component of the electrostatic discharge block 140 reflected on the signal transmission line 130 may be removed, and consequently, the signals may be transmitted more rapidly through the signal transmission line 130.

Hence, the control block 150 may remove the capacitive component of the electrostatic discharge block 140 reflected on the signal transmission line 130 through a decoupling operation. The decoupling operation may be or comprise an electrical decoupling operation. The decoupling operation may be or comprise a physical decoupling operation. The electrical decoupling operation may electrically decouple the electrostatic discharge block 140 from the signal transmission line 130 based on a control signal, for example, by employing a MOS transistor. A physical decoupling operation may physically decouple the electrostatic discharge block 140 from the signal transmission line 130, for example by using a fuse.

Hence, the integrated circuit may protect an internal circuit 120 from an electrical shock by coupling an electrostatic discharge block 140 to the signal transmission line 130, and may also prevent the capacitive component of the electrostatic discharge block 140 to be reflected on the signal transmission line 130 by decoupling the electrostatic discharge block 140 from the signal transmission line 130 during the normal operation.

Figure 2:
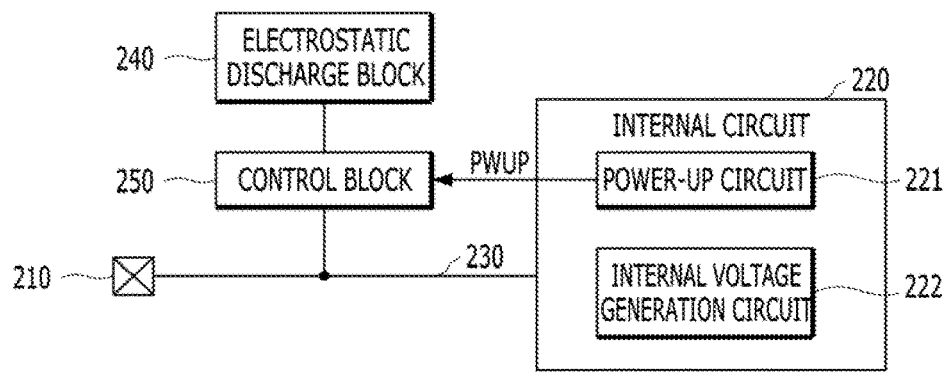
FIG. 2 is a block diagram illustrating an integrated circuit according to an embodiment of the present invention.

FIG. 2 is a block diagram illustrating an integrated circuit according to an embodiment of the present invention.

Referring to FIG. 2, the integrated circuit may include a pad 210, a signal transmission line 230, an electrostatic discharge block 240, and a control block 250. The pad 210 may receive signals from an external device or output the signals from the inside. The signal transmission line 230 may transmit the signals between the pad 210 and an internal circuit 220. The electrostatic discharge block 240 may protect the internal circuit 220 from an electrical shock transmitted from the external device. The control block 250 may decouple the electrostatic discharge block 240 from the signal transmission line 230 during the normal operation. The control block 250 may couple the electrostatic discharge block 240 to the signal transmission line 230 to prevent damage of the electrical circuit 220 from an electrical shock.

Diverse structures may be included in the internal circuit 220. FIG. 2 illustrates that a power-up circuit 221 and an internal voltage generation circuit 222 may be included in the internal circuit 220 as a detection block.

For example, the power-up circuit 221 may detect a moment when a voltage level of a power supply voltage VDD, which is a power source used for the internal circuit 220, rises to a predetermined voltage level and activate a power-up signal PWUP. Although it is described as an example that the voltage level of the power supply voltage VDD may be detected, the invention may not be limited in this way. For example, the power up circuit 221 may detect the voltage level of an internal voltage generated in the internal voltage generation circuit 222.

For example, the power-up signal PWUP may be activated when a stable voltage level of the power source used for the internal circuit 220 is secured so that the internal circuit 220 may perform a stable operation. Consequently, the power-up circuit 221 may detect a stable circuit operation moment and may then activate a power-up signal PWUP causing the control block 250 to decouple the electrostatic discharge block 240 from the signal transmission line 230.

Hereinafter, a simple circuit operation is described wherein the power-up signal PWUP may be disabled before the power source is applied to the Internal circuit 220. The control block 250 may couple the electrostatic discharge block 240 to the signal transmission line 230 in response to the power-up signal PWUP. Therefore, since the electrostatic discharge block 240 is coupled to the signal transmission line 230, the internal circuit 220 may be protected from the electrical shock although the electrical shock is transmitted.

The power-up signal PWUP may be activated when the power source is applied to the internal circuit 220 and the power source secures a predetermined voltage level. The control block 250 may decouple the electrostatic discharge block 240 from the signal transmission line 230 in response to the power-up signal PWUP. Therefore, the capacitive component of the electrostatic discharge block 240 reflected on the signal transmission line 230 may be removed, and consequently, the signals may be transmitted more rapidly through the signal transmission line 230.

When the power source is not reconnected to the internal circuit 220 again after the power source is applied to the internal circuit 220, the power-up signal PWUP may be disabled again, and the control block 250 may couple the electrostatic discharge block 240 to the signal transmission line 230 again. Therefore, it may be desired that the control block 250 has a structure capable of electrically coupling/decoupling the electrostatic discharge block 240 to/from the signal transmission line 230.

The integrated circuit may detect a stable circuit operation moment of the internal circuit 220 and decouple the electrostatic discharge block 240 from the signal transmission line 230 based on the stable circuit operation moment.

Figure 3:
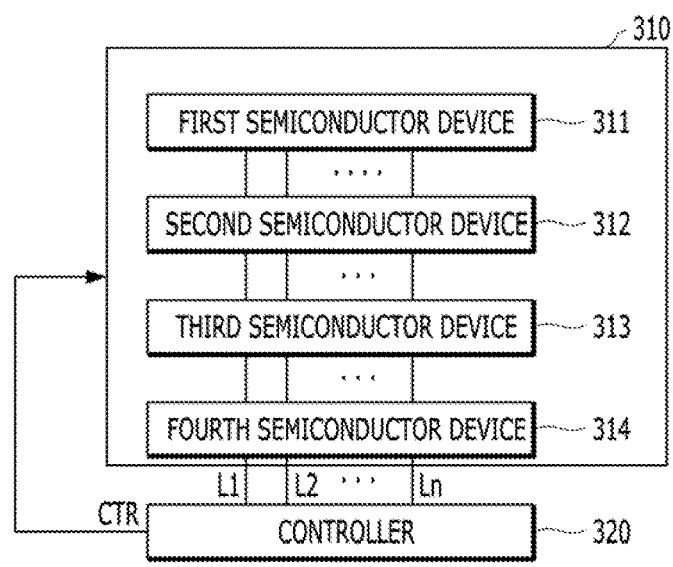
FIG. 3 is a block diagram illustrating a multi-chip package according to an embodiment of the present invention.

FIG. 3 is a block diagram illustrating a multi-chip package including a plurality of semiconductor devices 310 and a controller 320.

The semiconductor devices 310 may include first to fourth semiconductor devices 311, 312, 313 and 314, and each of the first to fourth semiconductor devices 311, 312, 313 and 314 may be formed in the same manner as described in the embodiment of FIG. 1.

The controller 320 may control the semiconductor devices 310. The controller 320 and the semiconductor devices 310 may be coupled to each other through a plurality of transmission lines L1, L2, . . . , and Ln, where n is a natural number. The controller 320 and the semiconductor devices 310 may transmit and receive a desired signal through the transmission lines L1, L2, . . . , and Ln, and the transmission lines L1, L2, . . . , and Ln may be coupled to the first to fourth semiconductor devices 311, 312, 313 and 314 in common.

To avoid unnecessary repetition, the first transmission line L1 among the transmission lines L1, L2, . . . , and Ln is representatively described below.

Figure 4:
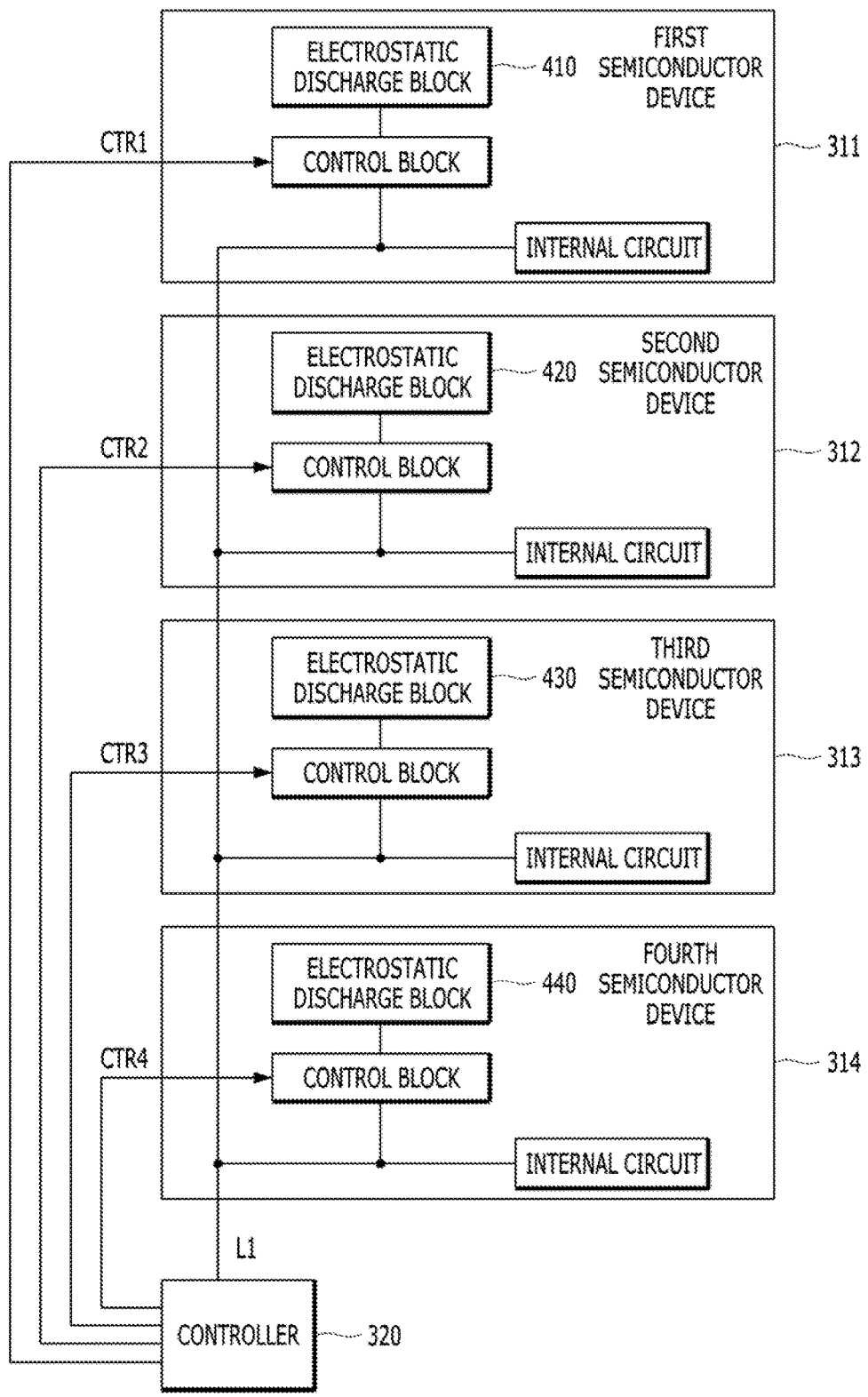
FIG. 4 is a diagram of a structure coupled to a first transmission line shown in FIG. 3.

FIG. 4 is a detailed diagram of a structure coupled to the first transmission line L1 shown in FIG. 3. For the sake of convenience in description, the following embodiment of the multi-chip package uses the same reference numerals appearing in FIG. 3.

Referring to FIG. 4, each of the first to fourth semiconductor devices 311, 312, 313 and 314 may include an electrostatic discharge block, a control block and an internal circuit. The internal circuit may be coupled to the first transmission line L1.

Electrostatic discharge blocks 410, 420, 430 and 440 arranged in the first to fourth semiconductor devices 311, 312, 313 and 314, respectively, may be decoupled from or coupled to the first transmission line L1 in response to first to fourth control signals CTR1, CTR2, CTR3 and CTR4 generated in the controller 320. As described above, the electrostatic discharge blocks 410, 420, 430 and 440 of the first to fourth semiconductor devices 311, 312, 313 and 314 may reflect a capacitive component in the first transmission line L1. Also since the controller 320 couples or decouples the electrostatic discharge blocks 410, 420, 430 and 440 of the first to fourth semiconductor devices 311, 312, 313 and 314 to or from the first transmission line L1 means that the capacitive component reflected on the first transmission line L1 is controlled.

For example, the controller 320 may couple the electrostatic discharge block 410 of the first semiconductor device 311 to the first transmission line L1 and decouple the electrostatic discharge blocks 420, 430 and 440 of the second to fourth semiconductor devices 312, 313 and 314 from the first transmission line L1 during a normal operation. In this case, the capacitive component of the electrostatic discharge block 410 of the first semiconductor device 311 may be reflected on the first transmission line L1. Similarly, it may be possible to couple two electrostatic discharge blocks 410 and 440 arranged in the first and fourth semiconductor devices 311 and 314, respectively, to the first transmission line L1. In this case, two capacitive components of the electrostatic discharge blocks 410 and 440 may be reflected on the first transmission line L1.

The multi-chip package according to the embodiment of the present invention may control the capacitive component of the first transmission line L1 based on a plurality of electrostatic discharge blocks arranged in a plurality of semiconductor devices.

Referring back to FIG. 3, the semiconductor devices 310 may be coupled to the controller 320. In other words, while the semiconductor devices 310 are decoupled from the controller 320, an electrical shock may be inputted through the transmission lines L1, L2, . . . , and Ln coupled to the controller 320. Therefore, the most effective way to prevent the electrical shock may be to couple the electrostatic discharge block of the fourth semiconductor device 314 among the first to fourth semiconductor devices 311, 312, 313 and 314 and decouple the other electrostatic discharge blocks before a normal operation. The fourth semiconductor device 314 may be arranged in an electrically closest position from a place where the electrical shock is inputted. As the electrostatic discharge block of the fourth semiconductor device 314 is coupled, the electrical shock may not be transmitted to the third semiconductor device 313 through the fourth semiconductor device 314.

According to present invention, signals transmitted between a pad and an internal circuit may be transmitted more rapidly as an electrostatic discharge operation is performed on an electrical shock. Also, a capacitive component of an ESD circuit, which is reflected on the internal circuit, may be removed during a normal operation.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

What is claimed is:

1. An integrated circuit, comprising:
a signal transmission line configured to transmit signals between a pad and an internal circuit;
an electrostatic discharge block configured to protect the internal circuit from an electrical shock transmitted through the signal transmission line; and a control block coupled between the electrostatic discharge block and the signal transmission line, and configured to selectively decouple the electrostatic discharge block from the signal transmission line, wherein the control block couples the electrostatic discharge block to the signal transmission line before a normal operation and decouples the electrostatic discharge block from the signal transmission line during the normal operation.

2. The integrated circuit of claim 1, wherein the control block electrically decouples the electrostatic discharge block from the signal transmission line.

3. The integrated circuit of claim 1, wherein the control block physically decouples the electrostatic discharge block from the signal transmission line.

4. An integrated circuit, comprising:
- a detection block configured to generate a control signal by detecting a stable circuit operation moment;
- a signal transmission line configured to transmit signals between a pad and an internal circuit including the detection block;
- an electrostatic discharge block configured to protect the internal circuit from an electrical shock transmitted through the signal transmission line; and
- a control block coupled between the electrostatic discharge block and the signal transmission line, and configured to selectively decouple the electrostatic discharge block from the signal transmission line, based on the control signal.

5. The integrated circuit of claim 4, wherein the detection block detects a voltage level of a power source used for the internal circuit to activate the control signal.

6. The integrated circuit of claim 4, wherein the control block electrically decouples the electrostatic discharge block from the signal transmission line in response to the control signal.

7. A multi-chip package, comprising:
- a plurality of semiconductor devices coupled to a common transmission line, wherein each of the semiconductor devices includes:
- an internal circuit coupled to the common transmission line;
- an electrostatic discharge block configured to protect the internal circuit from an electrical shock transmitted through the common transmission line; and
- a control block coupled between the electrostatic discharge block and the common transmission line, and configured to selectively decouple the electrostatic discharge block from the common transmission line.

8. The multi-chip package of claim 7, wherein at least one electrostatic discharge block among the electrostatic discharge blocks corresponding to the respective semiconductor devices is decoupled from the common transmission line.

9. The multi-chip package of claim 8, further comprising:
- a controller configured to control the respective control blocks included in the semiconductor devices.

10. The multi-chip package of claim 9, wherein the controller controls a capacitive component of the electrostatic discharge block reflected on the common transmission line by controlling the respective control blocks during a normal operation.

11. The multi-chip package of claim 7, wherein, before a normal operation, an electrostatic discharge block corresponding to a semiconductor device that is arranged in an electrically closest position from a place where the electrical shock is applied, is coupled, and the electrostatic discharge blocks corresponding to the other semiconductor devices are decoupled.

* * * * *